United States Patent
Chen et al.

(10) Patent No.: US 9,881,683 B1
(45) Date of Patent: Jan. 30, 2018

(54) SUPPRESSION OF PROGRAM DISTURB WITH BIT LINE AND SELECT GATE VOLTAGE REGULATION

(71) Applicant: Cypress Semiconductor Corporation, San Jose, CA (US)

(72) Inventors: Chun Chen, San Jose, CA (US); Kuo-Tung Chang, Saratoga, CA (US); Yoram Betser, Mazkeret Batya (IL); Shivananda Shetty, San Jose, CA (US); Giovanni Mazzeo, San Jose, CA (US); Tio Wei Neo, Fremont, CA (US); Pawan Singh, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/496,993

(22) Filed: Apr. 25, 2017

Related U.S. Application Data (60) Provisional application No. 62/433,598, filed on Dec. 13, 2016.

(51) Int. Cl.
| | |
|---|---|
| G11C 16/10 | (2006.01) |
| G11C 16/34 | (2006.01) |
| G11C 16/30 | (2006.01) |
| G11C 16/16 | (2006.01) |
| G11C 16/26 | (2006.01) |
| G11C 16/04 | (2006.01) |

(52) U.S. Cl.
CPC ...... *G11C 16/3427* (2013.01); *G11C 16/0425* (2013.01); *G11C 16/0466* (2013.01); *G11C 16/10* (2013.01); *G11C 16/16* (2013.01); *G11C 16/26* (2013.01); *G11C 16/30* (2013.01); *G11C 16/0433* (2013.01)

(58) Field of Classification Search
CPC ............ G11C 16/0425; G11C 16/0433
USPC .................... 365/185.14, 185.15
See application file for complete search history.

(56) References Cited

U.S. PATENT DOCUMENTS 6,560,152 B1 * 5/2003 Cernea ............... G11C 7/04 365/185.22
6,587,380 B2 * 7/2003 Kanai ............ G11C 16/0475 365/185.05

(Continued)

OTHER PUBLICATIONS

Brewer, Joe E., et al., "Nonvolatile Memory Technologies with Emphasis on Flash," IEEE Press Series on Microelectronic Systems, 788 pages, 2008.

(Continued)

*Primary Examiner* — Son Mai (57) ABSTRACT

Techniques for suppression of program disturb in memory devices are described herein. In an example embodiment, a memory device comprises a flash memory array coupled to a control circuit. The flash memory array comprises rows and columns of memory cells, where the memory cells in each row are coupled to a source line and to a select-gate (SG) line, and the memory cells in each column are coupled to a respective bit line (BL). The control circuit is configured to regulate both a first voltage, of a selected SG line, and a second voltage, of an unselected BL, independently of a power supply voltage of the flash memory array, and to adjust at least one of the first voltage and the second voltage based on a measure of an operating temperature of the memory device.

18 Claims, 5 Drawing Sheets

| Cell | MG/SG | BL | SL | Source | MG | SG | Drain | |
|------|-------|-----|------|--------|------|----------------|----------------|------|
| A | selected | selected | selected | 4~6V | 7~12V | 0.9V (regulated) | ~0.4V | 402A |
| B | selected | unselected | selected | 4~6V | 7~12V | 0.9V (regulated) | 1.2V (regulated) | 402B |
| C | unselected | selected | selected | 4~6V | 0~5V | 0V | ~0.4V | |
| D | unselected | unselected | selected | 4~6V | 0~5V | 0V | 1.2V (regulated) | |
| E | unselected | selected | unselected | 0V | 0~5V | 0V | ~0.4V | |
| F | unselected | unselected | unselected | 0V | 0~5V | 0V | 1.2V (regulated) | |

(56) References Cited

U.S. PATENT DOCUMENTS

| | | | | |
|---|---|---|---|---|
| 7,518,912 | B2* | 4/2009 | Hung | G11C 16/0433 257/315 |
| 7,529,126 | B2* | 5/2009 | Tanaka | G11C 16/10 365/185.02 |
| 7,606,099 | B2 | 10/2009 | Chung | |
| 7,881,117 | B2* | 2/2011 | Kim | G11O 5/145 365/185.2 |
| 8,020,055 | B2 | 9/2011 | Nguyen et al. | |
| 8,238,158 | B2 | 8/2012 | Shelton et al. | |
| 8,390,053 | B2* | 3/2013 | Akita | H01L 27/115 257/314 |
| 8,542,537 | B2 | 9/2013 | Parker | |
| 8,699,273 | B2 | 4/2014 | Binboga | |
| 9,472,284 | B2* | 10/2016 | Tran | G11C 29/76 |
| 9,570,188 | B2* | 2/2017 | Kanda | G11C 16/28 |
| 2007/0047307 | A1* | 3/2007 | Ogura | G11C 16/0475 365/185.11 |

OTHER PUBLICATIONS

International Search Report for International Application No. PCT/US17/45444 dated Aug. 25, 2017; 3 pages.
Written Opinion of the International Searching Authority for International Application No. PCT/US17/45444 dated Aug. 25, 2017; 6 pages.

* cited by examiner

SUPPRESSION OF PROGRAM DISTURB WITH BIT LINE AND SELECT GATE VOLTAGE REGULATION

PRIORITY

This application claims priority to U.S. Provisional Application No. 62/433,598, filed on Dec. 13, 2016, the entire content of which is incorporated by reference herein.

TECHNICAL FIELD

This disclosure generally relates to memory devices and, in particular, to reducing program disturbs in non-volatile memory cells.

BACKGROUND

Non-volatile memories are widely used for storing data in computing devices, and typically include a memory array with a large number of memory cells arranged in rows and columns. Each of the memory cells includes a non-volatile charge-trapping transistor that is programmed or erased by biasing a voltage of the proper polarity, magnitude, and duration between its control gate and its substrate. A positive gate-to-substrate voltage causes electrons to tunnel from the channel in the substrate to a charge-trapping dielectric layer raising a threshold voltage (VT) of the transistor, and a negative gate-to-channel voltage causes holes to tunnel from the channel to the charge-trapping dielectric layer lowering the threshold voltage.

Non-volatile memories suffer from program disturbs, which is an unintended and detrimental change in the net charge amount in a memory cell that increases its VT. A program disturb typically occurs when, during a memory operation to program a selected memory cell, an unselected memory cell, which shares the same gate or drain or source voltage as the selected cell, is programmed unintentionally. With manufacturing technology rapidly advancing to smaller geometry nodes (e.g., 40 nm and 28 nm nodes, etc.) it is increasingly difficult to avoid program disturbs. Further, since the magnitude of a program disturb increases at higher operating temperatures, the problem caused by program disturbs becomes worse as the density of non-volatile memories increases.

DETAILED DESCRIPTION

The following description sets forth numerous specific details such as examples of specific systems, components, methods, and so forth, in order to provide a good understanding of various embodiments of the techniques described herein for suppression of program disturb in memory devices. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Reference in the description to "an embodiment", "one embodiment", "an example embodiment", "some embodiments", and "various embodiments" means that a particular feature, structure, or characteristic described in connection with the embodiment(s) is included in at least one embodiment of the invention. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description and in which similar reference numbers may refer to similar components or operations. The drawings show illustrations in accordance with exemplary embodiments. These embodiments, which may also be referred to herein as "examples", are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the described subject matter but rather to enable one skilled in the art to practice, make, and/or use such subject matter.

During a program operation on a non-volatile memory cell, the source and the drain of the memory cell are biased under appropriate voltages to accelerate electrons within a channel region between the source and the drain. As electrons are accelerated, some of them acquire sufficient energy to be injected and get trapped inside a charge-trapping dielectric of the memory cell. This is known as hot electron injection. Such channel hot electrons (source side injection) are used to program a non-volatile memory cell (e.g., such as the split-gate flash memory cell in FIG. 1A, or the 2T memory cell in FIG. 1B). During a conventional program operation, the memory gate and the source of the memory cell are both biased at high voltages (e.g., the memory gate at 10V, and the source at 5V) to generate channel hot electrons. Under such biasing, the select gate (SG) of the memory cell needs to be biased above the threshold voltage (VT) of the select-gate transistor to turn on the channel between the source and the drain.

When a targeted cell of a non-volatile memory (NVM) array is selected to be programmed, its source and its select gate are biased at high voltages to generate channel hot electrons as discussed above. However, an unselected memory cell on the same row of the NVM array may share the same source line and select-gate line with the targeted/selected cell, and therefore the source and the select gate of the unselected memory cell are also biased at the same high voltages as the selected cell. Thus, during the program operation of the selected memory cell, the unselected memory cell (which may share the same gate or drain or source voltage as the selected cell) may be programmed unintentionally. This is commonly referred to as program disturb. In order to avoid such program disturb, the channel of the unselected memory cell needs to be shut off completely.

Figure 3:
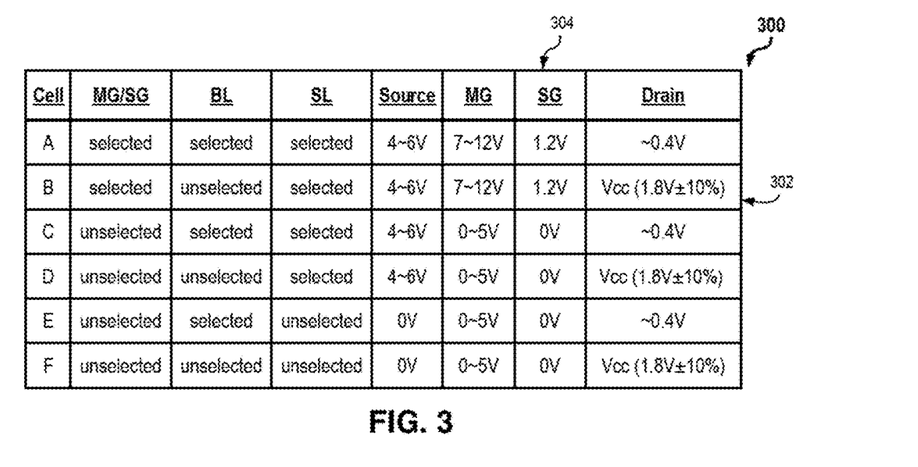
FIG. 3 illustrates a table with unregulated voltages applied during a program memory operation on some flash memory arrays.

In some conventional techniques for suppression of program disturbs, the select gate sub-threshold leakage of an unselected memory cell is shut-off by applying the power supply voltage (Vcc) of the NVM array on unselected bit lines (BLs). An example of such bias condition is illustrated in table 300 in FIG. 3, with Vcc=1.8V (as indicated at 302). The selected select-gate (SG) line is biased at 1.2V (as indicated at 304). Thus, the SG transistor of an unselected memory cell (e.g., cell "B") has a −0.6V bias between its select gate (SG) and its drain (D) (i.e., 1.2V−1.8V=−0.6V). Such bias condition is sufficient to completely eliminate sub-threshold leakage in the unselected cell (e.g., cell "B") during programming of a selected memory cell (cell "A"), and thus there is no program disturb concern for the unselected memory cell (e.g., cell "B"). However, manufacturing technology is rapidly advancing to smaller geometry nodes such as 40 nm and 28 nm nodes, where a smaller number indicates a narrower channel between the source and the drain of the memory transistor in the memory cell. Under smaller geometry nodes with shorter channels, the power supply voltage Vcc is reduced to 1.1V or even to 0.9V. Meanwhile, during a program operation the select gate (SG) of the memory cell still needs to be biased high enough to pass enough current to program a selected cell. However, when the select-gate voltage of an unselected memory cell is not much lower than its drain voltage, the SG transistors of the unselected cell will have sub-threshold leakage and will generate program disturb on the unselected memory cell. This problem gets worse when the unselected memory cell has low select-gate threshold voltage VT due to process variation during manufacturing of the NVM array and when the NVM array is operated at a higher temperature. Thus, it becomes impossible to avoid program disturb of unselected cells at all necessary operating temperatures and at the Vcc operation range (which may vary by as much as ±10%) by using the conventional techniques for program disturb suppression, which rely on applying the power supply voltage Vcc on the unselected bit lines (BLs) and a fixed voltage on the select-gate (SG) lines.

To address these and other problems related to program disturbs, described herein are various embodiments of techniques for suppression of program disturb in non-volatile memory cells. In one example embodiment, a memory device comprises a flash memory array and a control circuit coupled thereto. The flash memory array comprises rows and columns of memory cells, where the memory cells in a particular row are coupled to a source line (e.g., such as a common source line) and to a select-gate (SG) line (e.g., such as a common SG line), and where the memory cells in each particular column are coupled to a respective bit line. The control circuit is configured to regulate, independently of a power supply voltage of the flash memory array, both a first voltage of a selected SG line and a second voltage of an unselected bit line, and to adjust at least one of the first voltage and the second voltage based on a measure of an operating temperature of the memory device and/or of the flash memory array. In an example aspect, a first memory cell is coupled to the selected SG line during a memory operation to program the first memory cell, and a second memory cell is coupled to the unselected bit line during the memory operation, where the second memory cell is adjacent/neighbor to the first memory cell in the same row of the flash memory array. In this aspect, the control circuit is configured to suppress program disturb at the second memory cell during the memory operation by regulating the first voltage in a range of 0.9V to 1.1V and regulating the second voltage in a range of 0.4V to 1.2V. In one aspect, the control circuit is configured operate the first voltage lower than the power supply voltage, and in another aspect the control circuit is configured operate the second voltage higher than the power supply voltage. In an example aspect, the control circuit is configured with trim values for the first voltage and the second voltage at the time of manufacture of the memory device, where the trim values may be configured for the entire memory device or separately for each block of memory cells in the flash memory array. In an example aspect, the memory cells of the flash memory array are manufactured as 40 nm technology nodes, where the memory cells can be spilt-gate non-volatile memory cells or two-transistor (2T) non-volatile memory cells.

In another example embodiment, a method for suppressing program disturb in a flash memory array comprises the operations of: programming a first memory cell in the flash memory array that comprises rows and columns of memory cells, where the memory cells in a particular row are coupled to a source line (e.g., such as a common source line) and to a common select-gate (SG) line (e.g., such as a common SG line), and where the memory cells in a particular column are coupled to a respective particular bit line; regulating a first voltage of a selected SG line coupled to the first memory cell independently of a power supply voltage of the flash memory array during the programming of the first memory cell; regulating a second voltage of an unselected bit line coupled to a second memory cell of the flash memory array independently of the power supply voltage during the programming of the first memory cell, where the second memory cell is adjacent/neighbor to the first memory cell in the same row of the flash memory array; and adjusting at least one of the first voltage and the second voltage based on a measure of an operating temperature of the flash memory array. In an example aspect, regulating the first voltage comprises operating the first voltage lower than the power supply voltage. In another example aspect, regulating the second voltage comprises operating the second voltage higher than the power supply voltage. In an example aspect, to suppress the program disturb at the second memory cell during the programming of the first memory cell, the method comprises regulating the first voltage in a range of 0.9V to 1.1V, and regulating the second voltage in a range of 0.4V to 1.2V. In an example aspect, trim values for the first voltage and the second voltage are configured at the time of manufacture of a non-volatile memory device that comprises the flash memory array, where the trim values are configured for the entire non-volatile memory device or for separately each block of memory cells in the flash memory array.

In another example embodiment, a system comprises a power supply and a flash memory array coupled thereto. The power supply is configured to provide a power supply voltage to the flash memory array. The flash memory array comprises rows and columns of memory cells, where the memory cells in a particular row are coupled to a source line (e.g., such as a common source line) and to a select-gate (SG) line (e.g., such as a common SG line), and where the memory cells in a particular column are coupled to a respective bit line. The flash memory array further comprises a control circuit configured to regulate, independently of the power supply voltage, both a first voltage of a selected SG line and a second voltage of an unselected bit line, and to adjust at least one of the first voltage and the second voltage based on a measure of an operating temperature of the flash memory array. In one example aspect, the power supply is coupled to a non-volatile memory device that includes the flash memory array. In another example aspect, the system comprises a processing device coupled to the flash memory array. In another example aspect, the power supply, the flash memory array, and the processing device are disposed on the same semiconductor substrate, e.g., on the substrate of an integrated circuit (IC) semiconductor device.

Figure 1A:
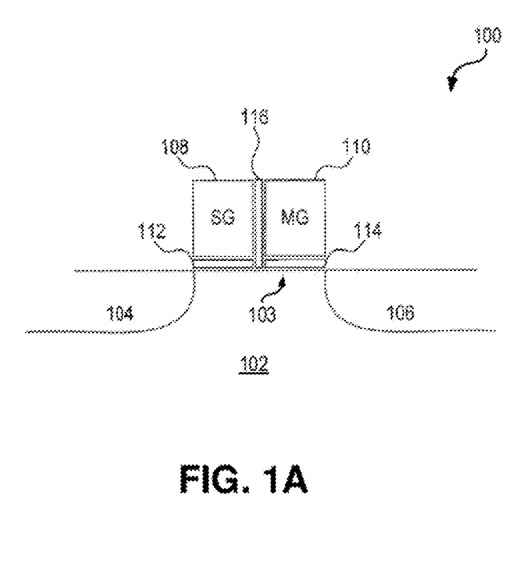
FIG. 1A is a block diagram illustrating a cross-section of an example split-gate non-volatile memory cell for memory devices according to some embodiments.

FIG. 1A illustrates a cross-section of an example split-gate non-volatile memory cell 100. A split-gate memory cell is a flash memory cell that is formed by use of a transistor device with a select gate and a memory gate placed side by side, a drain junction disposed at the select gate side, and a source junction disposed at memory gate side. In FIG. 1A, memory cell 100 is formed on a substrate 102, such as silicon. Substrate 102 is commonly p-type or a p-type well while a doped source region 106 and a doped drain region 104 are n-type. (It is noted that in some embodiments it is also possible for the substrate to be n-type while the source and drain regions are p-type.) Source region 106 and drain region 104 form the source and the drain, respectively, of the split-gate non-volatile memory cell 100. In various embodiments, memory cell 100 may be manufactured as a smaller geometry node, such as a 40 nm node or a 28 nm node.

Memory cell 100 includes a transistor with two gates, a select gate (SG) 108 and a memory gate (MG) 110. A select gate is the gate of a select transistor, the voltage of which controls the current flow of a split-gate memory cell. A memory gate is the gate of a memory transistor, whose threshold voltage can be changed by altering the amount of charges trapped in the split-gate memory cell. Each gate may comprise a gate conductor such as doped polycrystalline silicon ("poly") layer formed by deposit and etch techniques, for example, to define the gate structure. Select gate 108 is disposed over a dielectric layer 112. Memory gate 110 is disposed over a charge-trapping dielectric 114 having one or more dielectric layers. In one example, charge-trapping dielectric 114 includes a charge-trapping silicon nitride layer sandwiched between two silicon dioxide layers to create a three-layer stack collectively and commonly referred to as oxide-nitride-oxide ("ONO") stack. Some embodiments may use other charge trapping dielectrics that may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation (insulation) between the two gates. In some examples, vertical dielectric 116 and charge-trapping dielectric 114 are the same dielectric, while in other examples one dielectric is formed before the other (e.g., the two dielectrics can have different dielectric properties). As such, vertical dielectric 116 may or may not include the same film structure as charge-trapping dielectric 114. After the gates have been defined, source 106 and drain 104 are created by implanting dopants using, for example, an ion implantation technique.

An example "program" operation on memory cell 100 may include performing an erase operation followed by a write operation (e.g., if a "high" bit needs to be stored in the memory cell as part of the programming). Thus, a program operation is a memory operation that changes the net charge amount in a non-volatile memory cell to increase the threshold voltage VT of its memory transistor, typically through increasing the net charge amount stored in the charge-trapping layer of the cell. An erase operation is a memory operation to change the net charge amount in a non-volatile memory cell to reduce the threshold voltage VT of its memory transistor, typically through reducing the net charge amount stored in the charge-trapping layer of the cell. In order to "erase" any charge that may be stored within memory cell 100 and return the state of memory cell 100 to a "low" bit in an erase operation, a positive voltage is applied to source 106 while drain 104 is floated or at a certain bias, and select gate 108 and substrate 102 are typically grounded. A high negative voltage is applied to memory gate 110. The bias conditions between memory gate 110 and source 106 generate holes through band-to-band tunneling. The generated holes are sufficiently energized by the strong, electric field under memory gate 110 and are injected upwards from channel region 103 into charge-trapping dielectric 114. The injected holes effectively erase the memory cell 100 to the "low" bit state. If a bit needs to be stored in memory cell 100, in a follow-on write operation a positive voltage is applied to source 106 while drain 104 is either grounded or at a certain lower bias, and substrate 102 is grounded. A low positive voltage is applied to select gate 108 while a higher positive voltage is applied to memory gate 110. As electrons are accelerated within channel region 103 between the source 106 and the drain 104, some of them will acquire sufficient energy to be injected upwards and get trapped inside charge-trapping dielectric 114. The charge trapped within charge-trapping dielectric 114 stores a "high" bit within memory cell 100, even after the various supply voltages are removed.

In order to "read" the stored bit of memory cell 100 in a read memory operation, a low voltage is applied to each of the select gate 108, memory gate 110, and drain 104 while source 106 and substrate 102 are typically grounded. The low voltage applied to memory gate 110 may be chosen so that it lies substantially equidistant between the threshold voltage necessary to turn on the transistor when storing a "high" bit and the threshold voltage necessary to turn on the transistor when storing a "low" bit, in order to clearly distinguish between the two states. Thus, if the application of the low voltage during the read operation causes a sense amplifier to detect a flow of substantial current in channel region 103 between source 106 and drain 104, then the memory cell holds a "low" bit. Alternatively, if the application of the low voltage during the read operation does not cause the sense amplifier to detect a flow of substantial current in the channel region 103 between source 106 and drain 104, then the memory cell holds a "high" bit.

Figure 1B:
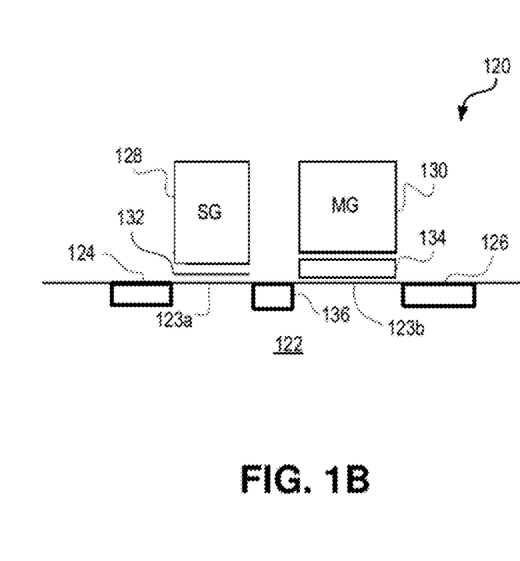
FIG. 1B is a block diagram illustrating a cross-section of an example two-transistor (2T) non-volatile memory cell for memory devices according to some embodiments.

FIG. 1B illustrates a cross-section of an example two-transistor (2T) non-volatile memory cell 120 that is formed on a substrate 122, such as silicon. Substrate 122 is commonly p-type or a p-type well while source (or source region) 126 and drain (or drain region) 124 are doped n-type regions. (It is noted, however, that in some embodiments it is also possible for the substrate to be n-type while the source and drain regions are p-type.) In various embodiments, memory cell 120 may be manufactured as a smaller geometry node, such as a 40 nm node or a 28 nm node.

In memory cell 120, one transistor may be a memory transistor having memory gate (MG) 130, while another transistor may be a select (or pass) transistor having select gate (SG) 128. Memory cell 120 may also include source 126, drain 124, and optionally a drain area 136 on the substrate 122 between memory gate 130 and select gate 128. The pass transistor with select gate 128 may be a field-effect transistor (FET) (e.g., a metal-oxide-semiconductor field-effect transistor, or MOSFET) that has a select-gate dielectric layer 132 and is configured as a switch to control voltage levels and/or current levels at the contact nodes of memory cell 120 (e.g., at the source and/or drain of the pass transistor and/or the memory transistor). The memory transistor with memory gate 130 with may be a transistor configured to store a bit of binary information, for example by varying the charge stored in charge-trapping layer 134 of the memory transistor.

Program and read memory operations for 2T memory cell 120 are performed by applying voltages and biasing the memory cell in a similar manner as split-gate memory cell 100 of FIG. 1A. In order to "erase" any charge that may be stored within memory cell 120 and return the state of memory cell 120 to a "low" bit in an erase operation, a positive voltage is applied to source 126 while drain 124 is floated or at a certain bias, and select gate 128 and substrate 122 are typically grounded. A high negative voltage is applied to memory gate 130. The bias conditions between memory gate 130 and source 126 generate holes, and the generated holes are sufficiently energized to be injected upwards from channel region 123b into charge-trapping dielectric 134. The injected holes effectively erase the memory cell 120 to the "low" bit state. If a bit needs to be stored in memory cell 120, in a follow-on write operation a positive voltage is applied to source 126 while drain 124 is either grounded or at a certain lower bias, and substrate 122 is grounded. A low positive voltage is applied to select gate 128 while a higher positive voltage is applied to memory gate 130. As electrons are accelerated within channel regions 123a and 123b between the source 126 and the drain 124, some of them will acquire sufficient energy to be injected upwards and get trapped inside charge-trapping dielectric 134. The charge trapped within charge-trapping dielectric 134 stores a "high" bit within memory cell 120, even after the various supply voltages are removed. In order to "read" the stored bit of memory cell 120 in a read memory operation, a low voltage is applied to each of the select gate 128, memory gate 130, and drain 124 while source 126 and substrate 102 are typically grounded. If the application of the low voltage during the read operation causes a sense amplifier to detect a flow of substantial current in channel regions 123a and 123b between source 126 and drain 124, then the memory cell holds a "low" bit. Alternatively, if the application of the low voltage during the "read" operation does not cause the sense amplifier to detect a flow of substantial current in the channel regions 123a and 123b between source 126 and drain 124, then the memory cell holds a "high" bit.

Figure 1C:
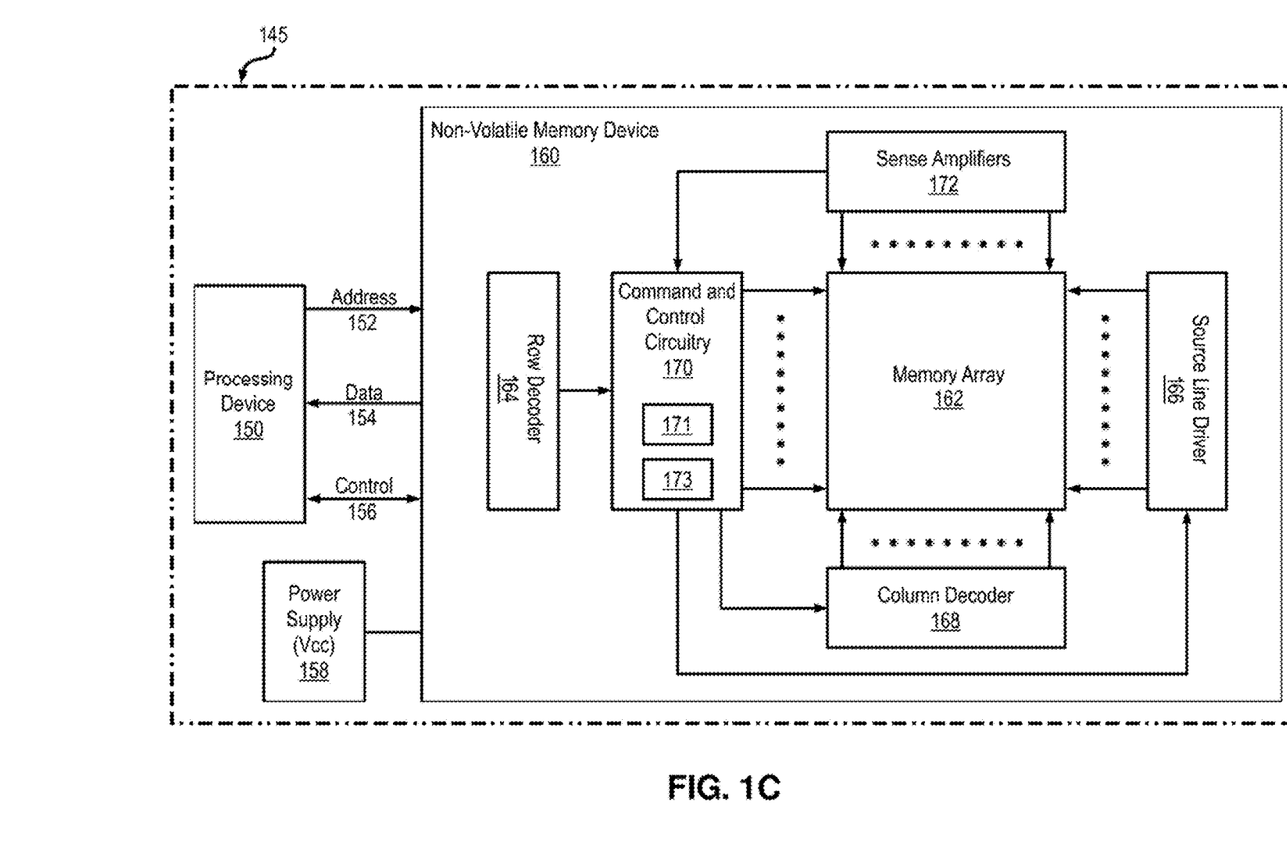
FIG. 1C is a block diagram illustrating an example non-volatile memory (NVM) system according to some embodiments.

Computing devices (e.g., such as laptop/notebook computers, tablets, smartphones, and the like) may store data, configuration information, and/or programs in non-volatile memory (NVM) such as, for example, flash memory including NAND and NOR, EEPROM, and F-RAM. FIG. 1C is a block diagram illustrating an example NVM system 145. In some embodiments, NVM system 145 may be implemented as an embedded on-chip subsystem (e.g., a flash macro that includes additional components such as SRAM memory, a microprocessor, and other hardware components) within a microcontroller unit (MCU) disposed on a semiconductor substrate, such as the substrate of an integrated circuit (IC) device. In some embodiments (e.g., as illustrated in FIG. 1C), NVM system 145 may include a processing device 150 coupled to NVM device 160 via address bus 152, data bus 154, and control bus 156. It should be appreciated that in FIG. 1C NVM system 145 has been simplified for the purpose of illustration, and is therefore not intended to be a complete description. In particular, details of the various hardware components illustrated in FIG. 1C (e.g., processing device 150, row decoder 164, source line driver 166, column decoder 168, command and control circuitry 170, sense amplifiers 172, etc.) are not described in detail herein. It should also be appreciated that NVM system 145 may include some, all, or different/additional components than the embodiment in FIG. 1C. Thus, NVM system 145 in FIG. 1C should be regarded in an illustrative rather than a restrictive sense.

Power supply 158 is coupled to NVM device 160 to provide a power supply voltage Vcc thereto. In some embodiments, the power supply voltage Vcc may be around 1.8V±10%. Power supply 158 may be external and/or internal to NVM device 160, and is used by NVM device 160 to generate voltage signals, such as high voltage (HV) signals that are above the highest voltage provided by the power supply and low voltage (LV) signals that are below the lowest voltage provided by the power supply (e.g., ground voltage). In some embodiments, power supply 158 may be configured to receive control signals and/or configuration data from processing device 150 and/or NVM device 160.

Processing device 150 may reside on a common carrier substrate such as, for example, an integrated circuit (IC) die substrate, a multi-chip module substrate, or the like. Alternatively, the components of processing device 150 may be one or more separate integrated circuits and/or discrete components. In one exemplary embodiment, processing device 150 may be a device from the Programmable System on a Chip (PSoC®) family of devices, developed by Cypress Semiconductor Corporation, San Jose, Calif. Alternatively, processing device 150 may be one or more other processing devices such as, for example, a microprocessor or central processing unit ("CPU"), a microcontroller ("MCU"), a controller, a special-purpose processor, a digital signal processor ("DSP"), an application specific integrated circuit ("ASIC"), a field programmable gate array ("FPGA"), or the like.

NVM device 160 includes non-volatile memory array 162, such as a flash memory array. A flash memory array is a group of flash memory cells organized into rows and columns, so each memory cell can be accessed randomly by row and column address through row and column decoder circuits. Memory array 162 is organized as rows and columns of non-volatile memory cells such as, for example, the split-gate memory cell 100 in FIG. 1A or the 2T memory cell 120 in FIG. 1B. In various embodiments, memory array 162 may include memory cells manufactured as smaller geometry nodes, such as a 40 nm node or a 28 nm node. As illustrated in FIG. 1C, memory array 162 may be coupled to row decoder 164 either directly or through command and control circuitry 170 via one more busses, multiple select lines, and/or read lines. Memory array 162 is also coupled to column decoder 168 via multiple bit lines (e.g., one bit line each for each column of the memory array). Memory array 162 is also coupled to source line driver 166, which is configured to control the source lines (SLs) coupled to the sources of the memory cells in the array. In some embodiments, the SLs of the memory array may be dedicated lines coupled to separate blocks, sectors, or pages of memory array 162, and the source line driver 166 may be configured to apply the same SL line voltage to the respective SLs per block, sector, or page. In other embodiments, the source lines may be common source lines (CSLs) that are shared between particular rows of cells in memory array 162, and the source line driver 166 may be configured to apply the same SL line voltage to separate groups of one or more SLs of the memory array. Such CSLs may be implemented to reduce the overall footprint of each memory cell along with multiple select lines, read lines and/or bit lines that are coupled to, and may be shared by, the memory cells in the array. Memory array 162 may be coupled to sense amplifiers 172 (e.g., directly, or via column decoder 168) that are configured to read multi-bit words from the memory cells in the array.

NVM device 160 also includes command and control circuitry 170, which includes voltage regulation circuit 171 and temperature sensing and control circuit 173. Command/control circuitry 170 is configured to receive signals (e.g., from processing device 150), to send control and command signals (e.g., to row decoder 164, source line driver 166, column decoder 168, sense amplifiers 172, etc.), and to control voltage signals applied to memory array 162 during various memory operations. Such voltage signals may be generated by or routed through voltage regulation circuit 171. Voltage regulation circuit 171 is configured to apply precise voltages, including high voltage signals and low voltage signals, to the memory cells during program, erase, write, and read memory operations, and/or other operations that are performed on memory array 162. Temperature sensing/control circuit 173 is configured with one or more temperature sensors to sense the operating temperature of NVM device 160 and/or of memory array 162. Command/control circuitry 170 is configured to select a particular row of memory array 162 for a program operation by applying a first voltage to a particular select-gate line that is coupled to the memory cells the particular row. Command/control circuitry 170 is also configured to control column decoder 168 to select a memory cell in the particular row for programming by applying an appropriate voltage to a particular bit line in a particular column, and to apply a second voltage to the unselected bit lines that are coupled to memory cells adjacent/neighboring to the selected memory cell in the particular row. Command/control circuitry 170 may be further configured to apply (e.g., through source line driver 166) an appropriate voltage to one or more common source lines that may be coupled to the memory cells in the particular row of memory array 162.

According to the techniques for suppression of program disturb described herein, voltage regulation circuit 171 is configured with charge pumps, pass transistors, logic gates, and other hardware circuitry to generate and regulate, independently from the power supply voltage Vcc, the precise voltage signals that are used to operate memory array 162 during program operations. Temperature sensing/control circuit 173 is configured with one or more diodes, logic gates, and other hardware circuitry to sense the operating temperature of NVM device 160 (and/or of memory array 162) and to provide signals to voltage regulation circuit 171 regarding the sensed operating temperature. During program operations, command/control circuitry 170 (and/or the circuits 171 and 173 therein) are configured to regulate both the voltage of a selected select-gate (SG) line and the voltage of any/all unselected bit lines independently of the power supply voltage Vcc, and to adjust one or both of these two voltages based on the sensed operating temperature. In some example embodiments, during a program operation command/control circuitry 170 is configured to regulate and apply a voltage in the range of 0.9V to 1.1V to the select-gate (SG) line of a row of memory cells, and to regulate and apply a voltage in the range of 0.4 to 1.2V to the bit lines (BLs) of the memory array, with a regulated voltage of 1.2V being applied to any/all unselected BLs in order to suppress program disturb of unselected memory cells. In some embodiments, during a program operation command/control circuitry 170 is also configured to adjust the SG line voltages and/or the BL voltages based on the sensed operating temperature of the NVM device and/or the memory array. In this manner, command/control circuitry 170 (and/or the circuits 171 and 173 therein) provide for suppression of program disturb on unselected memory cells, in accordance with the techniques described herein.

Figure 2:
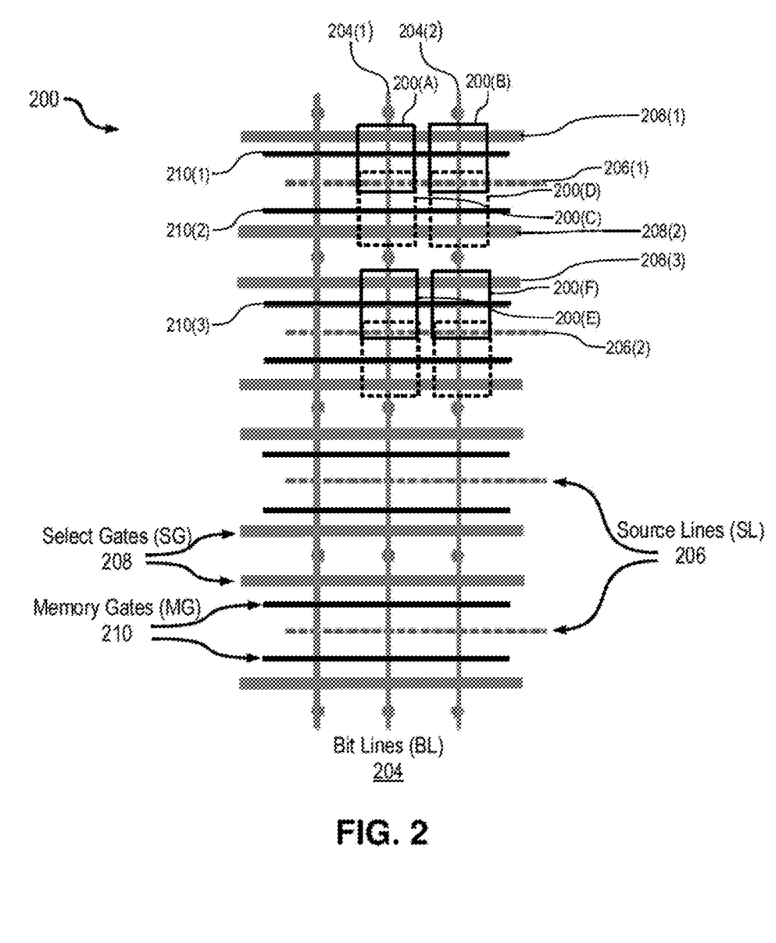
FIG. 2 is a block diagram illustrating a flash memory array according to an example embodiment.

FIG. 2 is a block diagram illustrating a flash memory array 200 according to an example embodiment (e.g., such as memory array 162 in FIG. 1C). In FIG. 2, memory array 200 is organized as rows and columns of non-volatile memory cells such as, for example, the split-gate memory cell 100 in FIG. 1A or the 2T memory cell 120 in FIG. 1B. It should be appreciated, however, that the terms "rows" and "columns" of memory cells are used herein for purposes of illustration, rather than limitation. For example, in the embodiment of FIG. 2, the memory cell rows are arranged horizontally and the memory cell columns are arranged vertically. However, in various embodiments, the orientation of the "rows" and "columns" may be reversed, used in an opposite sense, or arranged in a different orientation. Thus, the description herein of memory array 200 in terms of rows and columns is to be regarded in an illustrative rather than a restrictive sense.

Memory array 200 comprises bit lines (BL) 204, with each bit line being coupled to the drains of the memory cells in a corresponding column of the array. Memory array 200 also comprises source lines (SL) 206. In some embodiments, source lines 206 may be dedicated lines coupled to separate blocks, sectors, or pages of memory array 200. In other embodiments, the source lines may be common source lines (CSLs) that are shared between particular rows of cells in memory array 200, e.g., with each particular source line being coupled to the sources of the memory cells in a respective row of the array. Memory array 200 also comprises select-gate (SG) lines 208 and memory gate (MG) lines 210, with each SG line and each MG line being coupled to the select gates and the memory gates, respectively, of the memory cells in a corresponding row of the array. The BLs 204, SLs 206, SG lines 208, and MG lines 210 are formed of metal (and/or other conductivity) layers that are electrically insulated from each other and are disposed on the substrate a semiconductor memory device.

As illustrated in FIG. 2, memory array 200 includes non-volatile memory cells 200A (cell "A"), 200B (cell "B"), 200C (cell "C"), 200D (cell "D"), 200E (cell "E"), 200F (cell "F"), and others (not labeled with referenced numerals). In various embodiments, the memory cells of memory array 200 may be manufactured as smaller geometry nodes, such as a 40 nm node or a 28 nm node. NVM cell 200A comprises a drain that is electrically coupled to bit line 204(1), a source that is electrically coupled to source line 206(1), a select-gate that is electrically coupled to SG line 208(1), and a memory gate that is electrically coupled to MG line 210(1). NVM cell 200B comprises a drain that is electrically coupled to bit line 204(2), a source that is electrically coupled to source line 206(1), a select-gate that is electrically coupled to SG line 208(1), and a memory gate that is electrically coupled to MG line 210(1). Thus, NVM cell 200B is adjacent to NVM cell 200A on the same row and shares therewith the same common source line 206(1), SG line 208(1), and MG line 210(1). NVM cell 200C comprises a drain that is electrically coupled to bit line 204(1), a source that is electrically coupled to source line 206(1), a select-gate that is electrically coupled to SG line 208(2), and a memory gate that is electrically coupled to MG line 210(2). NVM cell 200C shares the same common source line 206(1) with NVM cells 200A and 200B. NVM cell 200D comprises a drain that is electrically coupled to bit line 204(2), a source that is electrically coupled to source line 206(1), a select-gate that is electrically coupled to SG line 208(2), and a memory gate that is electrically coupled to MG line 210(2). Thus, NVM cell 200D is adjacent to NVM cell 200C on the same row and shares the same common source line 206(1) with NVMs cells 200A, 200B and 200D, as well as the same SG line 208(2) and the same MG line 210(2) with NVM cell 200C. Similarly, NVM cell 200E comprises a drain that is electrically coupled to bit line 204(1), a source that is electrically coupled to source line 206(2), a select-gate that is electrically coupled to SG line 208(3), and a memory gate that is electrically coupled to MG line 210(3). NVM cell 200F comprises a drain that is electrically coupled to bit line 204(2), a source that is electrically coupled to source line 206(2), a select-gate that is electrically coupled to SG line 208(3), and a memory gate that is electrically coupled to MG line 210(3). Thus, NVM cell 200F is adjacent to NVM cell 200E on the same row and shares therewith the same common source line 206(2), SG line 208(3), and MG line 210(3).

During program operations on memory array 200, according to the techniques described herein a control circuit coupled to the array is configured to precisely regulate both the voltage of a selected select-gate (SG) line and the voltage of any/all unselected bit lines independently of the power supply voltage of the memory array 200, and to adjust one or both of these two voltages based on the sensed operating temperature. For example, during a program operation on NVM cell 200A, the control circuit applies: (a) a regulated precise voltage (e.g., at 0.9V) to SG line 208(1) that is lower than the power supply voltage Vcc (e.g., at 1.1V); and (b) regulated precise voltages to bit lines 204(1) and 204(2), where the voltage (e.g., at −0.4V) applied to bit line 204(1) for NVM cell 200A is lower than the power supply voltage Vcc and the voltage (e.g., at 1.2V) applied to bit line 204(2) for NVM cell 200B is higher than the power supply voltage Vcc. In this manner, as applied to memory array 200, the techniques described herein provide for suppression of program disturb on the unselected memory cell NVM 200B while the selected memory cell, NVM 200A, is being programmed.

In some embodiments, a flash memory array comprises split-gate or 2T non-volatile memory cells arranged in rows and columns (e.g., such as memory array 200 in FIG. 2). In these embodiments, memory cells in the same row share the same select-gate (SG) line and memory gate (MG) line, and the memory cells in the same column share the same bit line (BL). During a program operation, both the voltage of a selected SG line and the voltage of the unselected bit lines are regulated by a voltage regulation circuit and are substantially independent of the power supply voltage Vcc. Thus, both the voltage on the selected SG line and the voltage on the unselected bit lines are held at suitable fixed values and are not affected by the variation of power supplied voltage, which usually has +/−10% variation. This provides for applying the voltage(s) necessary to perform the program operation on the selected memory cell, while at the same time maintaining the proper bias voltages that are sufficient to prevent program disturb of any/all unselected memory cells. Further, since the voltage regulation circuit generates the applied voltages with precise magnitudes, a bias of a smaller magnitude between the selected SG voltage and the unselected BL voltage is sufficient to suppress program disturb on the unselected memory cells, thereby providing for suppressing such program disturb over the entire temperature operation range and voltage supply range of the flash memory array.

In some embodiments, the selected SG line voltage for selected memory cells is regulated at a voltage level that is lower than the voltage level of the power supply voltage Vcc. For example, the power supply voltage Vcc may be around 1.1V±10%, while the selected SG line voltage can be regulated at around 0.9V. Similarly, in some embodiments the unselected BL voltage for any/all unselected cells is regulated at a voltage level that is higher than the voltage level of the power supply voltage Vcc. For example, the power supply voltage Vcc may be around 1.1V±10%, while the unselected BL voltage can be regulated at around 1.2V.

Figure 4:
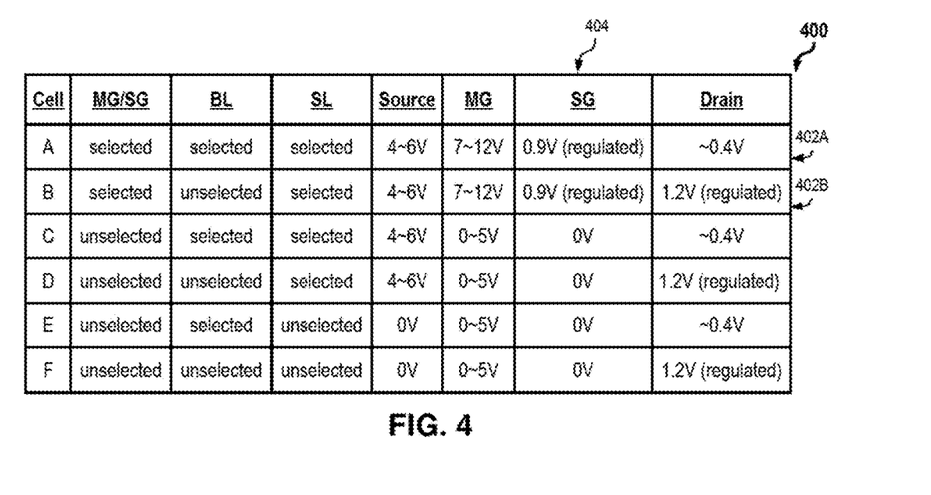
FIG. 4 illustrates a table with regulated bit-line and select-gate voltages applied during program operations, in accordance with an example embodiment.

FIG. 4 illustrates table 400 with regulated select-gate (SG) and bit line (BL) voltages applied during program operations, in accordance with an example embodiment in which a power supply voltage Vcc=1.1V. As illustrated in FIG. 4, during a program operation both the selected SG line voltage and the unselected BL voltage are regulated to voltages that are different from the power voltage supply—e.g., with the SG line voltage being regulated at 0.9V (as indicated at 404) and the BL voltage being regulated at −0.4V for a selected memory cell (as indicated at 402A) and at 1.2V for an unselected memory cell (as indicated at 402B). The benefit of this voltage regulation and application scheme is that the SG of the unselected memory cell "B" has a −0.3V bias between its select gate (SG) and its drain (D). This bias condition helps to eliminate any sub-threshold leakage of the unselected memory cell "B" during the programming of the selected memory cell "A", thereby suppressing the program disturb for the unselected cell "B". Further, this −0.3V bias between the select gate (SG) and the drain (D) of the unselected memory cell will be maintained even when the power supply voltage Vcc varies, because both the selected SG voltage and unselected BL voltage are regulated by a precise voltage regulation circuit.

In some embodiments, the selected select-gate (SG) line voltage can be trimmed by trim values generated at the time of manufacture independently for each die (or IC chip) or separately for each memory block of the flash memory array. In this manner, as long as the selected SG voltage for program operations is trimmed precisely in accordance with the threshold voltage VT of the select/pass transistors of each wafer or each die, the techniques described herein provide for reliable suppression of program disturb for unselected cells even though there will always be process variations at the time of manufacture that lead to variation of the threshold voltage VT. For example, on a die with a high SG transistor VT, the sub-threshold leakage of an unselected cell (e.g., cell "B" in FIG. 4) is low, and the trimming described herein ensures that the selected SG voltage is kept high enough to turn on the SG transistor of a selected cell (e.g., cell "A" in FIG. 4) during a program operation on the selected cell. Also, on such die with a high SG transistor VT, the unselected BL voltage does not need to be trimmed at very high voltage. On the other hand, on a die with a low SG transistor VT, the sub-threshold leakage of an unselected cell (e.g., cell "B" in FIG. 4) will be high and therefore a major concern, but the trimming described herein ensures that the selected SG voltage will be kept low enough to shut off the SG transistor of the unselected cell during a program operation on a selected cell (e.g., cell "A" in FIG. 4).

In some embodiments, the selected select-gate (SG) line voltage and the unselected bit line (BL) voltage can be automatically adjusted based on the temperature of a non-volatile memory (NVM) device during its operation. This may be needed because the threshold voltage VT of a SG transistor becomes lower at higher operating temperatures. For example, when a selected memory cell (e.g., cell "A" in FIG. 4) is programmed at high temperature, in order to fully turn off the SG transistor of an unselected memory cell (e.g., cell "B" in FIG. 4), the selected SG voltage needs to be lower. On the other hand, when a selected memory cell (e.g., cell "A" in FIG. 4) is programmed at low temperature, in order to fully turn on the SG transistor of the selected cell (which has higher VT at low temperature), the selected SG voltage needs to be higher. In some embodiments, such temperature-based voltage adjustment can be implemented by using a temperature sensing and control circuit. When such circuit senses that the operating temperature of the NVM device increases, the circuit sends the appropriate temperature-indicating signals to a voltage regulation circuit, and the voltage regulation circuit automatically adjusts the selected SG bias to a lower voltage. When the temperature sensing and control circuit senses that the operating temperature of the NVM device decreases, the circuit sends the appropriate temperature-indicating signals to the voltage regulation circuit and the voltage regulation circuit automatically adjusts the selected SG bias to a higher voltage. In this manner, the techniques described herein provide for selected SG bias voltages and unselected BL voltages that are sufficient to prevent program disturb of unselected memory cells over the entire temperature range in which the NVM device needs to operate.

Figure 5:
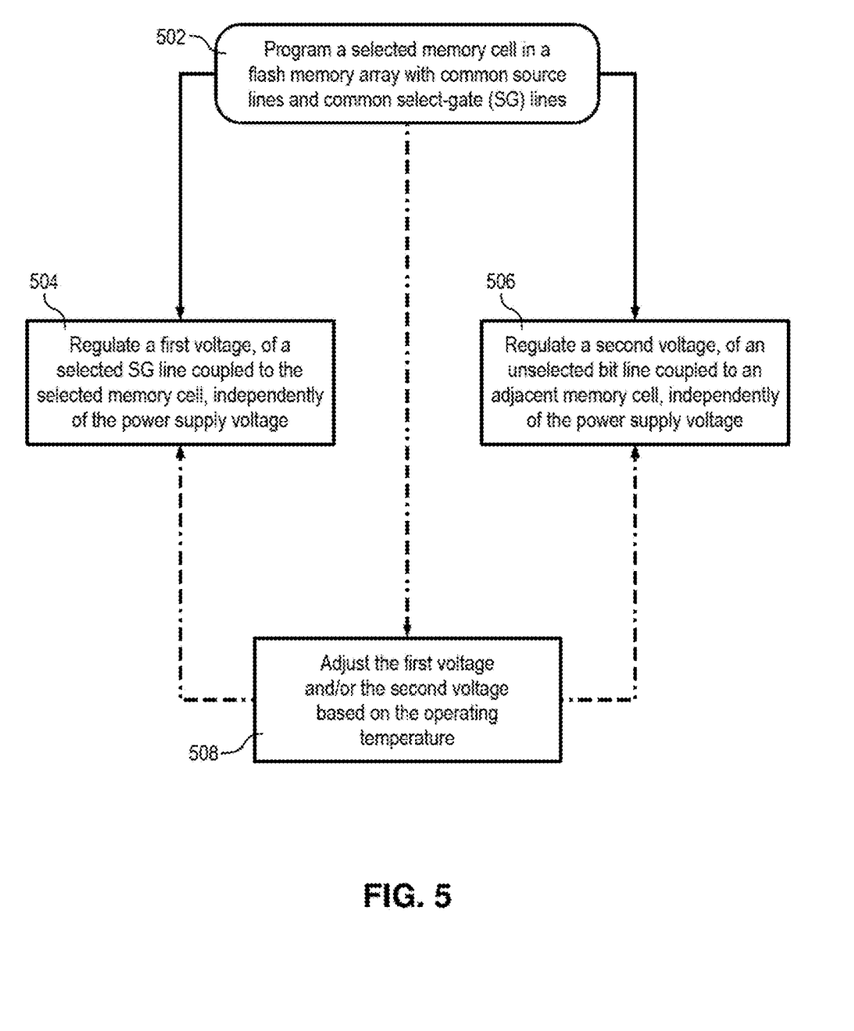
FIG. 5 is a flowchart illustrating a method for suppressing program disturb in a non-volatile memory array, according to an example embodiment.

FIG. 5 is a flowchart illustrating a method for suppressing program disturb in a non-volatile memory array, according to an example embodiment. The operations of the method in FIG. 5 are described as being performed by a control circuit (and/or circuits therein) of a non-volatile memory (NVM) device. It is noted, however, that various implementations and embodiments may use various, and possibly different, hardware components to perform the operations of the method in FIG. 5. For example, in various embodiments an MCU may be configured with firmware instructions which, when executed, are operable to cause performance of the method in FIG. 5 on an embedded NVM device. In another example, in various embodiments an NVM system may include a single-chip or multi-chip controller configured to perform the operations of the method in FIG. 5. Thus the description hereinafter, of the method in FIG. 5 as being performed by a control circuit (and/or circuits therein), is to be regarded in an illustrative rather than a restrictive sense.

In operation 502, a control circuit of an NVM device performs a memory operation to program a selected memory cell in a flash memory array, which provides common source lines and common select-gate (SG) lines to its memory cells. In various embodiments, the flash memory array may include memory cells manufactured as smaller geometry nodes, such as a 40 nm node or a 28 nm node.

In operation 504, the control circuit (or a voltage regulation circuit therein) precisely regulates a first voltage of a selected SG line independently of the power supply voltage of the NVM device, where the selected SG line is coupled to the selected memory cell. During the program operation, the control circuit (or the voltage regulation circuit therein) applies a regulated voltage of 0.9V to the selected SG line, which voltage is lower than the power supply voltage (e.g., at 1.1V).

In operation 506, the control circuit (or the voltage regulation circuit therein) precisely regulates a second voltage of an unselected bit line (BL) independently of the power supply voltage of the NVM device. The unselected BL is coupled to a memory cell that is adjacent to the selected memory cell in the same row of the flash memory array, and thus shares at least a common source with the selected cell. For instance, the adjacent memory cell may be immediately next to the selected memory cell, or may be a neighbor positioned one or more columns away from the selected cell. During the program operation, the control circuit (or the voltage regulation circuit therein) applies a regulated voltage of 1.2V to the unselected BL, which voltage is higher than the power supply voltage (e.g., at 1.1V).

In operation 508, the control circuit automatically adjusts one or both of the first voltage (applied to the selected SG line) and the second voltage (applied to the unselected bit line) based on the operating temperature of the NVM device and/or of the flash memory array therein. For example, during the program operation of the selected memory cell, a temperature sensing circuit may sense the operating temperature and may send a temperature-indicating signal to the control circuit (or to the voltage regulation circuit therein). In response to the temperature-indicating signal, the control circuit (or the voltage regulation circuit therein) may automatically adjust the selected SG voltage and/or the unselected BL voltage. For example, when the temperature-indicating signal indicates that the operating temperature is increasing, the selected SG voltage may be automatically adjusted to a lower voltage and/or the unselected BL voltage may be automatically adjusted to a higher voltage. When the temperature-indicating signal indicates that the operating temperature is decreasing, the selected SG voltage may be automatically adjusted to a higher voltage and/or the unselected BL voltage may be automatically adjusted to a lower voltage.

In various embodiments, the techniques described herein for suppression of program disturb in a non-volatile memory (NVM) device provide for regulating both the selected select-gate (SG) voltage(s) and the unselected bit line (BL) voltage(s) independently of the power supply voltage of the NVM device. These regulated voltages can be re-configured during operation based on the sensed operation temperature of the NVM device. For example, at the time of manufacture the NVM device can be configured with trim values for the regulated voltages, where such trim values can be configured for the NVM device chip as a whole, or separately for each memory block of the NVM device. In this manner, the techniques described herein can accommodate wafer-to-wafer, chip-to-chip, and block-to-block process variations and still provide sufficient suppression of program disturb. Further, the techniques for suppression of program disturb described herein enable 40 nm embedded flash memory arrays to operate at high temperatures (e.g., up to 150° C.) without the need to use any high voltage devices in the bit line (BL) bias circuits, thereby maintaining smaller the silicon footage of flash memory array.

Various embodiments of the techniques described herein for suppression of program disturb in memory devices may include various operations. These operations may be performed by hardware components, firmware, or a combination thereof. As used herein, the terms "coupled to" and "coupled with" mean coupled directly or coupled indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as executable firmware instructions stored on a non-transitory computer-readable medium, e.g., such as volatile storage and/or non-volatile storage. Such instructions may be used to program one or more devices that include one or more general-purpose or special-purpose processors (e.g., such as Central Processing Units, or CPUs) or equivalents thereof (e.g., such as processing cores, processing engines, microcontrollers, and the like), so that when executed by the processor(s) or the equivalents thereof, the instructions cause the device(s) to perform various operations. The non-transitory computer-readable storage medium may include, but is not limited to, electromagnetic storage medium (e.g., floppy disks, hard disks, and the like), optical storage medium (e.g., CD-ROM), magneto-optical storage medium, read-only memory (ROM), random-access memory (RAM), erasable programmable memory (e.g., EPROM and EEPROM), flash memory, or another now-known or later-developed type of medium that is suitable for storing information.

Although the operations of any method(s) herein may be shown and described in a particular order, the order of the operations of each method may be altered so that certain operations may be performed in an inverse order or so that certain operation may be performed, at least in part, concurrently with other operations. In other embodiments, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A memory device comprising:
a flash memory array comprising rows and columns of memory cells, wherein the memory cells in a particular row are coupled to a particular source line and to a particular select-gate (SG) line, and wherein the memory cells in a particular column are coupled to a particular bit line; and
a control circuit coupled to the flash memory array and configured at least to:
regulate both a first voltage, of a selected SG line, and a second voltage, of an unselected bit line, independently of a power supply voltage of the flash memory array; and
adjust at least one of the first voltage and the second voltage based on a measure of an operating temperature of the memory device;
wherein the control circuit is configured to operate the second voltage higher than the power supply voltage.

2. The memory device of claim 1, wherein a first memory cell is coupled to the selected SG line during a memory operation to program the first memory cell, and a second memory cell is coupled to the unselected bit line during the memory operation, the second memory cell being adjacent to the first memory cell in the same row of the flash memory array.

3. The memory device of claim 2, wherein during the memory operation the control circuit is configured to regulate the first voltage in a first range of 0.9V to 1.1V and to regulate the second voltage in a second range of 0.4V to 1.2V.

4. The memory device of claim 1, wherein the control circuit is configured to operate the first voltage lower than the power supply voltage.

5. The memory device of claim 1, wherein the control circuit is configured with trim values for the first voltage and the second voltage at the time of manufacture of the memory device.

6. The memory device of claim 5, wherein the trim values are configured for the memory device or for each block of memory cells in the flash memory array.

7. The memory device of claim 1, wherein the memory cells of the flash memory array are spilt-gate memory cells manufactured as 40 nm nodes.

8. The memory device of claim 1, wherein the memory cells of the flash memory array are 2T memory cells manufactured as 40 nm nodes.

9. A method for suppression of program disturb, the method comprising:
programming a first memory cell in a flash memory array that comprises rows and columns of memory cells, wherein the memory cells in a particular row are coupled to a particular source line and to a particular select-gate (SG) line, and wherein the memory cells in a particular column are coupled to a particular bit line;
regulating a first voltage of a selected SG line coupled to the first memory cell independently of a power supply voltage of the flash memory array during the programming of the first memory cell;
regulating a second voltage of an unselected bit line coupled to a second memory cell of the flash memory array independently of the power supply voltage during the programming of the first memory cell, wherein the second memory cell is adjacent to the first memory cell in the same row of the flash memory array;
wherein regulating the second voltage comprises operating the second voltage higher than the power supply voltage; and
adjusting at least one of the first voltage and the second voltage based on a measure of an operating temperature of the flash memory array.

10. The method of claim 9, wherein regulating the first voltage comprises operating the first voltage lower than the power supply voltage.

11. The method of claim 9, wherein the first voltage is in a range of 0.9V to 1.1V.

12. The method of claim 9, wherein the second voltage is in a range of 0.4V to 1.2V.

13. The method of claim 9, wherein to suppress the program disturb at the second memory cell during the programming of the first memory cell, the method comprises:
regulating the first voltage in a first range of 0.9V to 1.1V;
regulating the second voltage in a second range of 0.4V to 1.2V.

14. The method of claim 9, wherein trim values for the first voltage and the second voltage are configured at the time of manufacture of a non-volatile memory device that comprises the flash memory array, wherein the trim values are configured for the non-volatile memory device or for each block of memory cells in the flash memory array.

15. The method of claim 9, wherein adjusting at least one of the first voltage and the second voltage comprises sensing the measure of the operating temperature of the flash memory array.

16. A system comprising:
a power supply configured to provide a power supply voltage; and
a flash memory array coupled to the power supply to receive the power supply voltage, the flash memory array comprising rows and columns of memory cells, wherein the memory cells in a particular row are coupled to a particular source line and to a particular select-gate (SG) line, and wherein the memory cells in a particular column are coupled to a particular bit line;
wherein the flash memory array comprises a control circuit configured at least to:
regulate, independently of the power supply voltage, both a first voltage of a selected SG line and a second voltage of an unselected bit line; and
adjust at least one of the first voltage and the second voltage based on a measure of an operating temperature of the flash memory array;
wherein the control circuit is configured to operate the second voltage higher than the power supply voltage.

17. The system of claim 16, further comprising a processing device coupled to the flash memory array.

18. The system of claim 17, wherein the power supply, the flash memory array, and the processing device are disposed on the same semiconductor substrate.

* * * * *